(12) United States Patent
Nabizada et al.

(10) Patent No.: US 12,123,899 B2
(45) Date of Patent: Oct. 22, 2024

(54) COMPONENT POWER DRAW DETECTION FOR ELECTRIC VEHICLE CHARGING STATION

(71) Applicant: SPEED CHARGE, LLC, Carter Lake, IA (US)

(72) Inventors: Jamshed Nabizada, Fremont, CA (US); Hsuan-Chung Lee, Newark, CA (US)

(73) Assignee: SPEED CHARGE, LLC, Carter Lake, IA (US)

( * ) Notice: Subject to any disclaimer, the term of this patent is extended or adjusted under 35 U.S.C. 154(b) by 75 days.

(21) Appl. No.: 18/070,369

(22) Filed: Nov. 28, 2022

(65) Prior Publication Data

US 2024/0175904 A1 May 30, 2024

(51) Int. Cl.

| | | |
|---|---|---|
| *G01R 19/165* | (2006.01) | |
| *B60L 53/302* | (2019.01) | |
| *F24F 11/49* | (2018.01) | |
| *G01R 31/56* | (2020.01) | |
| *G05B 15/02* | (2006.01) | |
| *F24F 140/60* | (2018.01) | |

(52) U.S. Cl.
CPC ........ *G01R 19/1659* (2013.01); *B60L 53/302* (2019.02); *F24F 11/49* (2018.01); *G01R 31/56* (2020.01); *G05B 15/02* (2013.01); *F24F 2140/60* (2018.01)

(58) Field of Classification Search
CPC ..... G01R 19/1659; G01R 31/56; F24F 11/49; F24F 2140/60; B60L 53/302; G05B 15/02
USPC ........................................................ 340/664
See application file for complete search history.

(56) References Cited

U.S. PATENT DOCUMENTS

| | | | |
|---|---|---|---|
| 2013/0346010 A1* | 12/2013 | Schulz .................... | B60L 53/14 324/602 |
| 2016/0137082 A1* | 5/2016 | Jefferies .................. | B60L 53/16 320/109 |
| 2016/0341798 A1* | 11/2016 | Fetzer .................... | H02J 7/0048 |
| 2019/0070970 A1* | 3/2019 | Chan ....................... | B60L 53/65 |
| 2023/0117226 A1* | 4/2023 | Kerdelhue ......... | G01R 31/3842 320/109 |
| 2023/0143398 A1* | 5/2023 | Ito ......................... | B60L 53/665 320/109 |

* cited by examiner

*Primary Examiner* — Kerri L McNally
(74) *Attorney, Agent, or Firm* — MARSHALL, GERSTEIN & BORUN LLP (57) ABSTRACT

An electric vehicle (EV) charging system is described herein. The EV charging system may be configured to determine if a component in the EV charging system is operating properly based upon current usage. For example, an EV charging station controller may measure a current corresponding to an input to an EV charging station. The EV charging station controller may further measure currents of reference components in the EV charging station, and then use the measured currents to determine if a component in the EV charging station is operating properly. In some examples, the component is a heating, ventilation, and air conditioning (HVAC) component in an EV charging station because it is particularly useful to know the operational status of an HVAC in EV charging systems (e.g., to ensure that the components charging the EV are the correct temperature).

20 Claims, 8 Drawing Sheets

| | 208V Three Phase (Wye) | | |
|---|---|---|---|
| | PHASE A | PHASE B | PHASE C |
| HVAC | - | 10.80 | - |
| HEATER | - | 13.32 | - |
| PUMP | 10.80 | - | - |
| ACDC2 | - | - | 4.12 |
| ACDC3 | - | - | 4.12 |

| | 208V Three Phase (Delta) | | |
|---|---|---|---|
| | PHASE A | PHASE B | PHASE C |
| HVAC | - | 5.40 | 5.40 |
| HEATER | - | 7.69 | 7.69 |
| PUMP | 5.40 | 5.40 | - |
| ACDC2 | 2.38 | - | 2.38 |
| ACDC3 | 2.38 | - | 2.38 |

| | 240V Split Phase (With Neutral) ||
| | PHASE A | PHASE B |
|---|---|---|
| HVAC | - | 10.80 |
| HEATER | - | 13.33 |
| PUMP | 10.80 | - |
| ACDC2 | 4.12 | - |
| ACDC3 | - | 4.12 |

| | 240V Split Phase (No Neutral) ||
| | PHASE A | PHASE B |
|---|---|---|
| HVAC | 5.40 | 5.40 |
| HEATER | 6.67 | 6.67 |
| PUMP | 5.40 | 5.40 |
| ACDC2 | 2.06 | 2.06 |
| ACDC3 | 2.06 | 2.06 |

| Component | Time to draw normal current |
|---|---|
| Cooling | ~2.5 mintues |
| Heating | ~20 seconds |
| Pump | Instant |
| ACDC2 | Instant |
| ACDC3 | Instant |

COMPONENT POWER DRAW DETECTION FOR ELECTRIC VEHICLE CHARGING STATION

TECHNICAL FIELD

The following relates to electric vehicle (EV) charging stations, and, more particularly, to determining whether a component in an EV charging station is operating properly.

BACKGROUND

In current electric vehicle (EV) charging stations, detecting whether a particular component, such as a heating, ventilation, and air conditioning (HVAC) component, is operating properly requires additional sensors (e.g., current sensors specific to the component). However, such additional sensors are expensive, and also add technical complexity to the EV charging station.

The systems and methods disclosed herein provide solutions to these problems and others.

SUMMARY

Embodiments disclosed herein provide systems, methods and apparatuses that enable an EV charging station to determine that a component is not operating properly. As described further herein, a method for determining whether a component in an EV charging station is operating properly may be provided, such a method may include: measuring, via an EV charging station controller, a first current, wherein the first current is a current corresponding to an input to the EV charging station; measuring, via EV charging station controller, a current of a first reference component; measuring, via the EV charging station controller, a current of a second reference component; determining, via the EV charging station controller, a summed current by summing the current of the first reference component and the current of the second reference component; determining, via the EV charging station controller, a remaining current by subtracting the summed current from the first current; and applying, via the EV charging station controller, a comparison rule to the remaining current to determine an operational status of the component.

In some embodiments, the first current is a current of a phase of Wye configured three phase power delivered to the EV charging station. In some embodiments, the first current is a current between phases of delta configured three phase power delivered to the EV charging station. In some embodiments, the first current is a current of a split phase or single phase power delivered to the EV charging station.

In some embodiments, the component is a heating, ventilation, and air conditioning (HVAC) component including a heater or a fan. In some embodiments, the first reference component comprises: an output or load of an energy storage component; a heater; a pump; or a charging head.

In some embodiments, the applying the comparison rule comprises: determining, via the EV charging station controller, that the remaining current is positive; and in response to the determination that the remaining current is positive, setting, via the EV charging station controller, the comparison rule according to a minimal on factor.

In some embodiments, the component is an HVAC component, and the method further comprises: determining, via the EV charging station controller, that the remaining current is positive; and in response to the determination that the remaining current is positive, the applying the comparison rule comprises determining that the HVAC component is powered on in response to a determination that the remaining current is greater than a minimal on factor multiplied by a nominal HVAC current, wherein the minimal on factor is between 0.4 and 0.45.

In some embodiments, the applying the comparison rule comprises: determining, via the EV charging station controller, that the remaining current is negative; and in response to the determination that the remaining current is negative, setting, via the EV charging station controller, the comparison rule according to a negative remaining current factor.

In some embodiments, applying the comparison rule determines the operational status to be inoperable; and in response to the determination that the operational status is inoperable, setting, via the one or more processors, a battery included in an energy storage module to charge at a reduced rate.

In another aspect, a non-transitory computer-readable storage medium for determining whether a component in an electric vehicle (EV) charging station is operating properly may be provided. The non-transitory computer-readable storage medium may comprise instructions that, when executed, cause a processor to: measure a first current, wherein the first current is a current corresponding to an input to the EV charging station; measure a current of a first reference component; measure a current of a second reference component; determine a summed current by summing the current of the first reference component and the current of the second reference component; determine a remaining current by subtracting the summed current from the first current; and apply a comparison rule to the remaining current to determine an operational status of the component.

In yet another aspect, a computer system for determining whether a component in an electric vehicle (EV) charging station is operating properly may be provided. The system may comprise: one or more processors; and a non-transitory program memory communicatively coupled to the one or more processors. The non-transitory program memory may store executable instructions that, when executed by the one or more processors, cause the computer system to: measure a first current, wherein the first current is a current corresponding to an input to the EV charging station; measure a current of a first reference component; measure a current of a second reference component; determine a summed current by summing the current of the first reference component and the current of the second reference component; determine a remaining current by subtracting the summed current from the first current; and apply a comparison rule to the remaining current to determine an operational status of the component.

Advantages will become more apparent to those skilled in the art from the following description of the preferred embodiments which have been shown and described by way of illustration. As will be realized, the present embodiments may be capable of other and different embodiments, and their details are capable of modification in various respects. Accordingly, the drawings and description are to be regarded as illustrative in nature and not as restrictive.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

Several aspects of electric vehicle (EV) or plug-in hybrid vehicle charging systems will now be presented with reference to various apparatuses and methods. These apparatuses and methods will be described in the following detailed description and illustrated in the accompanying drawings by various blocks, modules, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include read-only memory (ROM) or random-access memory (RAM), electrically erasable programmable ROM (EEPROM), including ROM implemented using a compact disc (CD) or other optical disk storage, magnetic disk storage or other magnetic storage devices, or any other medium that can be used to carry or store desired program code in the form of instructions or data structures and that can be accessed by a computer. Disk and disc, as used herein, includes CD, laser disc, optical disc, digital versatile disc (DVD), and floppy disk where disks usually reproduce data magnetically, while discs reproduce data optically with lasers. Combinations of the above should also be included within the scope of computer-readable media.

When operating EV charging stations, it may be useful to know whether an individual component on the EV charging station is operating properly. For example, if an HVAC component of an EV charging station is not operating properly, it may be desirable to reduce or stop the charging functions of the EV charging station to prevent overheating. However, for many components in the EV charging station, determining if the component is functioning properly requires placing separate, additional sensors in the EV charging station. These additional sensors may add technical complexity to the EV charging station, and are often expensive.

Certain aspects of this disclosure provide an EV charging system that can detect whether a particular component in the EV charging system is operating properly. In one working example, the techniques described herein may measure current corresponding to an input to the EV charging station (e.g., current a phase of a Wye configured power supply, current between phases of a delta configured power supply, or current of a single phase or split phase power supply, etc.). In this example, the current of reference components may also be measured, and an analysis may be performed on the measured currents to determine the operational status of a component.

Example System

Figure 1:
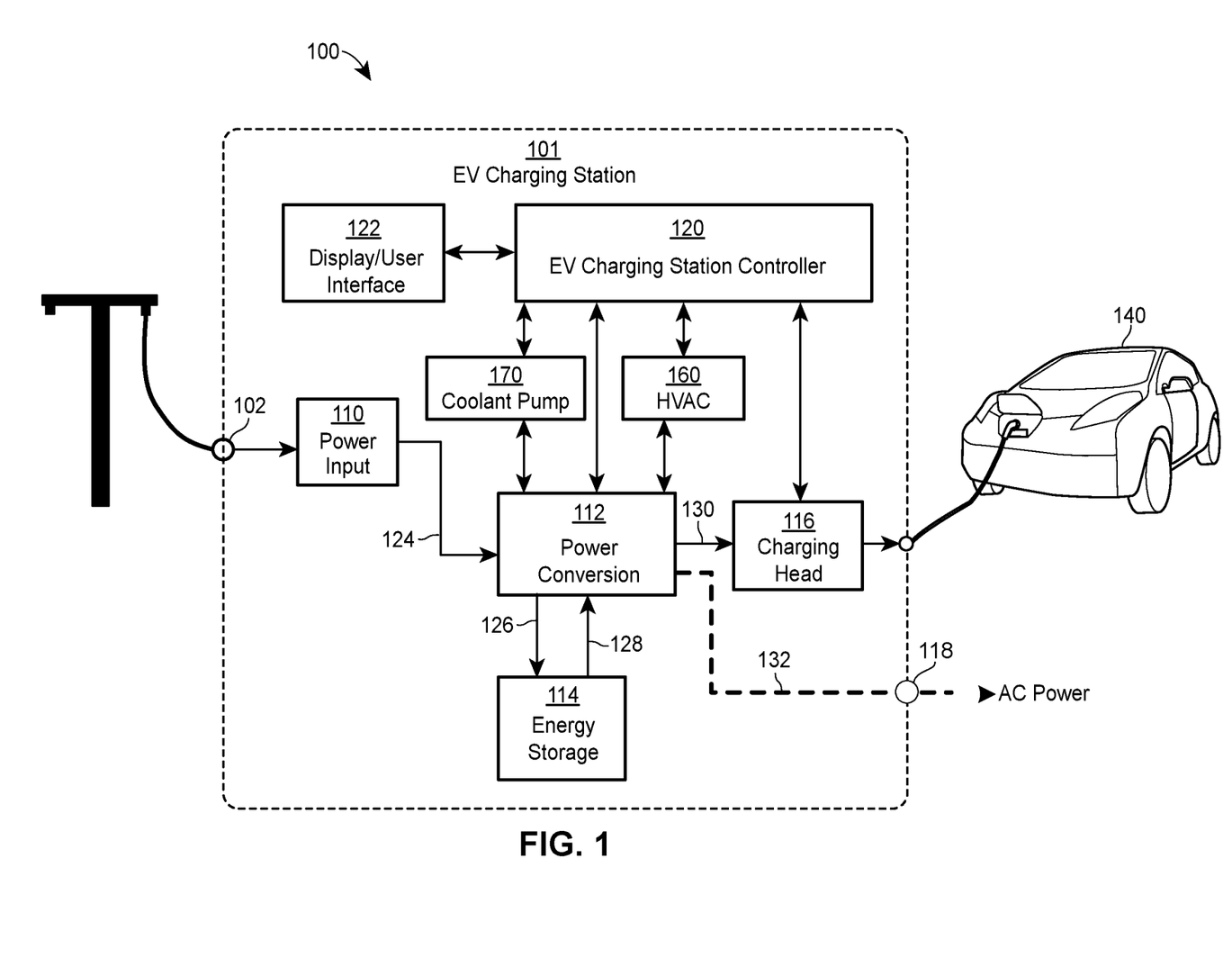
FIG. 1 illustrates an example of an electric vehicle charging system configured in accordance with certain aspects disclosed herein.

An example of such a system to determine operational status of a component is illustrated in the example EV charging system 100 of FIG. 1. The EV charging system 100 may determine the operational status of any suitable component. For example, the system 100 may determine the operational status of a heating, ventilation, and air conditioning (HVAC) component 160, which may be used to heat and/or cool the EV charging station 101. The HVAC component 160 may include any suitable components, such as fans, heaters, condensers, pumps, etc. Determining the operational status of the HVAC component 160 is particularly useful because it allows the EV charging system 100 to take appropriate action if the HVAC component 160 is not functioning properly (e.g., stop charging the EV, charge the EV at a reduced rate, etc.).

The illustrated EV charging system 100 may include EV charging station 101, and may be provided in a residence, commercial property or publicly-accessible parking facility.

The EV charging system 100 includes a power input module 110 that includes one or more circuits configurable to transform, condition or otherwise modify alternating current (AC) power received from an input port 102, to provide conditioned power 124 to a power conversion module 112. The power conversion module 112 includes an AC-to-DC conversion circuit that generates a DC charging current 126 that is provided to an energy storage module 114. In various embodiments, the power input module 110 and the power conversion module 112 may be combined, or their functions may be differently configured (e.g., by converting the input AC power to DC power at the power input module 110). In one example, the energy storage module 114 includes high-capacity batteries that have a storage capacity greater than a multiple of the storage capacity in the EVs to be charged (e.g., three times, five times, or ten times a specific or average EV battery capacity).

In a residential implementation where N EVs are expected to receive a daily charge of P kW on a regular basis, the energy storage module 114 may have a storage capacity of at least (N+1)×P KW in order to accommodate the expected daily demand. In some instances, P may be set to the maximum charge capacity of each of the EVs. In other instances, the storage capacity of the energy storage module 114 may be configured based on expected usage of the EVs and resultant daily depletion in charge.

In an EV charging system 100 provided for commercial or public use, the storage capacity of the energy storage module 114 may be configured based on the maximum number of expected charging events in a day. The maximum number of expected charging events in a day may be calculated based on times of day in which the EV charging system 100 is made accessible. The storage capacity of the energy storage module 114 may further be configured based on the expected average charge per charging event, which may depend upon factors such as the types of EVs charged, the depletion level of the EV batteries when charging starts, and the duration of each charging event. For example, a retail parking site may have more charging events of shorter duration, while a commuter train parking lot may have fewer charging events of longer duration.

In various examples, the storage capacity of the energy storage module 114 may be configured based on maximum expected charging offset by power received from an electric utility. In some of these examples, the power received from an electric utility may be limited to power available during low-demand times, such as off-peak or low-priced periods of the day. The power input module 110 may be configured to block or disconnect inflows of power during peak or high-priced periods of the day. In some instances, the power input module 110 may be configured to enable power reception during peak periods to ensure continued operation of the EV charging system 100 when power levels in the energy storage module 114 are unexpectedly low.

According to certain aspects of this disclosure, the power conversion module 112 may include one or more DC-to-DC conversion circuits that receive DC current 128 at a first voltage level from the energy storage module 114 and drive a charging current 130 to an EV 140 through a charging head 116. The EV charging system 100 may be coupled to multiple charging heads 116 and the power conversion module 112 may include a corresponding number of DC-to-DC conversion circuits. In some instances, the charging head 116 may include power control circuits that further modify or control the voltage level of the charging current 130 passed through to the EV 140.

In some examples, the power conversion module 112 includes one or more inverters that convert the DC current 128 to an AC current 132 that can be provided at an AC output 118 of the EV charging system 100. The AC output 118 may be used to power one or more external charging heads or may be provided as backup power source for more general use. For example, the AC output 118 may comprise an outlet into which AC devices may be plugged or a direct connection to one or more devices or circuits in order to provide backup power at the site of the EV charging system 100.

According to certain aspects of this disclosure, an EV charging station controller 120 may be configured to control operations of the power conversion module 112. The EV charging station controller 120 may monitor and control power levels received by the power input module 110, power levels output through the charging current 130 and/or the AC current 132 and energy levels in the energy storage module 114. The EV charging station controller 120 may monitor temperatures within the EV charging system 100 and/or within different components of the EV charging system 100 and may be configured to mitigate increases in temperature through active cooling (e.g., using one or more HVAC components 160 or coolant pumps 170) or power reductions (e.g., by reducing currents 126, 128, or 130).

The EV charging station controller 120 may be configured to communicate with the components of the EV charging system 100, including power conversion, inverter and power conditioning circuits over one or more data communication links. The EV charging station controller 120 may be configured to communicate with controllers or sensors coupled to the energy storage module 114, the charging head 116 and external devices, including an EV being charged. The EV charging station controller 120 may manage, implement or support one or more data communication protocols used to control communication over the various communication links. The data communication protocols may be defined by industry standards bodies or may be proprietary protocols.

In some examples, the power conversion module 112 includes some combination of AC-to-DC, DC-to-DC and/or DC-to-AC converters that enables efficient conversion of AC input power received from a power utility to a DC charging current 126 provided to the energy storage module 114 and from the energy storage module 114 to EV 140. In one example, an inverter may be configured to achieve greater efficiency and cost effectiveness while enabling at least 150 KW charging levels, in contrast to the 120 KW levels provided by other systems. In some instances, the EV charging system 100 can provide an output current at or above 1000 volts that can match higher battery voltages used in some EVs 140. The higher voltage levels can enable faster, more efficient charging.

The EV charging station 101 may also include a user interface module 122 that can receive tactile or spoken input and can display information related to the operation of the EV charging system 100. The user interface module 122 may include or be coupled to a display with capabilities that reflect intended use of the EV charging system 100. In one example, a large nineteen-inch touchscreen may be provided to present details of charging status and user instructions, including instructions describing the method of connecting an EV 140. In another example, a small (four to six inch) LCD panel and display may be provided by the EV charging system 100. The user interface module 122 may include or be coupled to a touchscreen that interacts with the EV charging station controller 120 to provide additional information or advertising. The EV charging station controller 120 may include or be coupled to a wireless communication interface that can be used to deliver a wide variety of content to users of the EV charging system 100, including advertisements, news, point-of-sale content for products/services that can be purchased through the user interface module 122. The display system may be customized to match commercial branding of the operator, to accommodate language options and for other purposes.

Through the user interface module 122, the EV charging station controller 120 may provide information to enable the user to start charging, to confirm the start of charging, and to track the status of charging and so on. The user interface module 122 may support various input devices, including identity cards, touchless credit cards and other devices that interact through near-field communication protocols. The user interface module 122 may support user authentication protocols and may include or be coupled to biometric input devices such as fingerprint scanners, iris scanners, facial recognition systems and the like.

In one aspect of this disclosure, the energy storage module 114 is provisioned with a large battery pack and the EV charging station controller 120 is controlled by software that is configured to manage input received from an electrical power grid to the battery pack such that power is drawn from the grid to charge the battery pack at low-cost time periods and to avoid drawing power from the grid during peak-cost hours. The software may be further configured to manage power output to provide full, fast charging power in accordance with usage generated by monitoring patterns of usage by the EV charging system 100. The use of historical information can avoid situations in which the battery pack becomes fully discharged or depleted beyond a minimum energy threshold. For example, charging may be limited at a first time based upon a predicted later demand at a second time, which later demand may be predicted using historical information. This may spread limited charging capacity more evenly among vehicles throughout the course of a day or in other situations in which battery pack capacity is expected to be insufficient to fully charge all EVs over a time interval, taking account of the ability to add charge to the energy storage module 114.

In some examples, the energy storage module 114 may include additional air cooling for the battery pack and/or liquid cooling for the space surrounding the battery pack. Thermal blankets may also be used for warming batteries in cold conditions, and metal plates can be added to act as buffers and/or as additional heat sinks for cooling. In some examples, the liquid cooling may be provided by the coolant pump 170, which may be controlled by the EV charging station controller 120.

In one example, the energy storage module 114 is provisioned with a battery pack that can deliver 160 kWh can charge a series of EVs 140 without significant delays between EVs 140 and without the energy storage module 114 falling below 50% capacity. The battery pack may be fully recharged during the lowest-cost periods of the day when local grid demand is lowest, which may correspond to late night or early morning hours. The EV charging system 100 may draw power from the electric grid at normal residential levels (e.g., <30 kW) and may be used at virtually all existing premises without utility upgrades, construction costs and associated delays in approvals, permits, construction projects for such upgrades.

In certain examples, one or more EV charging systems 100 may be prefabricated and preconfigured, such that they can be installed within a few hours of delivery. Each EV charging system 100 occupies a small footprint and can be connected directly to an existing utility service access point provided on the premises. Installation of these EV charging systems 100 may be accomplished after providing conduit as needed from electrical service access points, and bolting the EV charging systems 100 to the ground or to a wall. The EV charging systems 100 can charge EVs 140 within hours of installation. In one example, an EV charging system 100 is enclosed in single metal housing that integrates batteries, inverters, power conversion circuits, wiring harnesses and control systems including the EV charging station controller 120 and other components of a battery management system (BMS).

Although the example system 100 shows only one charging head 116, two or more charging heads 116 may be provided to enable concurrent charging of multiple EVs 140. The EV charging station controller 120 may be configured by a user to support multiple modes of operation and may define procedures for power distribution that preserve energy levels in the energy storage module 114 when multiple EVs 140 are being concurrently charged. Distribution of power may be configured to enable fast charging of one or more EVs 140 at the expense of other EVs 140. In this regard, the charging ports may be prioritized or the EV charging station controller 120 may be capable of identifying and prioritizing connected EVs 140. In some instances, a user may identify priorities dynamically through the user interface module 122. For example, the EV charging station controller 120 may be configured to continue charging a first EV 140 at a maximum 120 KW when a second EV 140 is connected to a charging port, and may refrain from charging the second EV 140 until the charging rate for the first EV 140 drops below 60 KW. Reductions in charging rate may be configured to prevent thermal issues as the EV 140 approaches full charge. In this example, a 120 KW available power level may be split according to priorities.

In other examples, the EV charging station controller 120 may be configured to automatically split available power between two EVs 140 after the second EV 140 is connected. The available power may be evenly split between two EVs 140 or may be split according to priorities or capabilities. In some examples, the EV charging station controller 120 may conduct arbitration or negotiation between connected EVs to determine a split of charging capacity. An EV 140 may request a charging power level at any given moment based on temperature, battery charge level, and other characteristics of the EV 140 and its environment and to achieve maximum charge rate and minimum charging time for the current circumstances.

Figure 2:
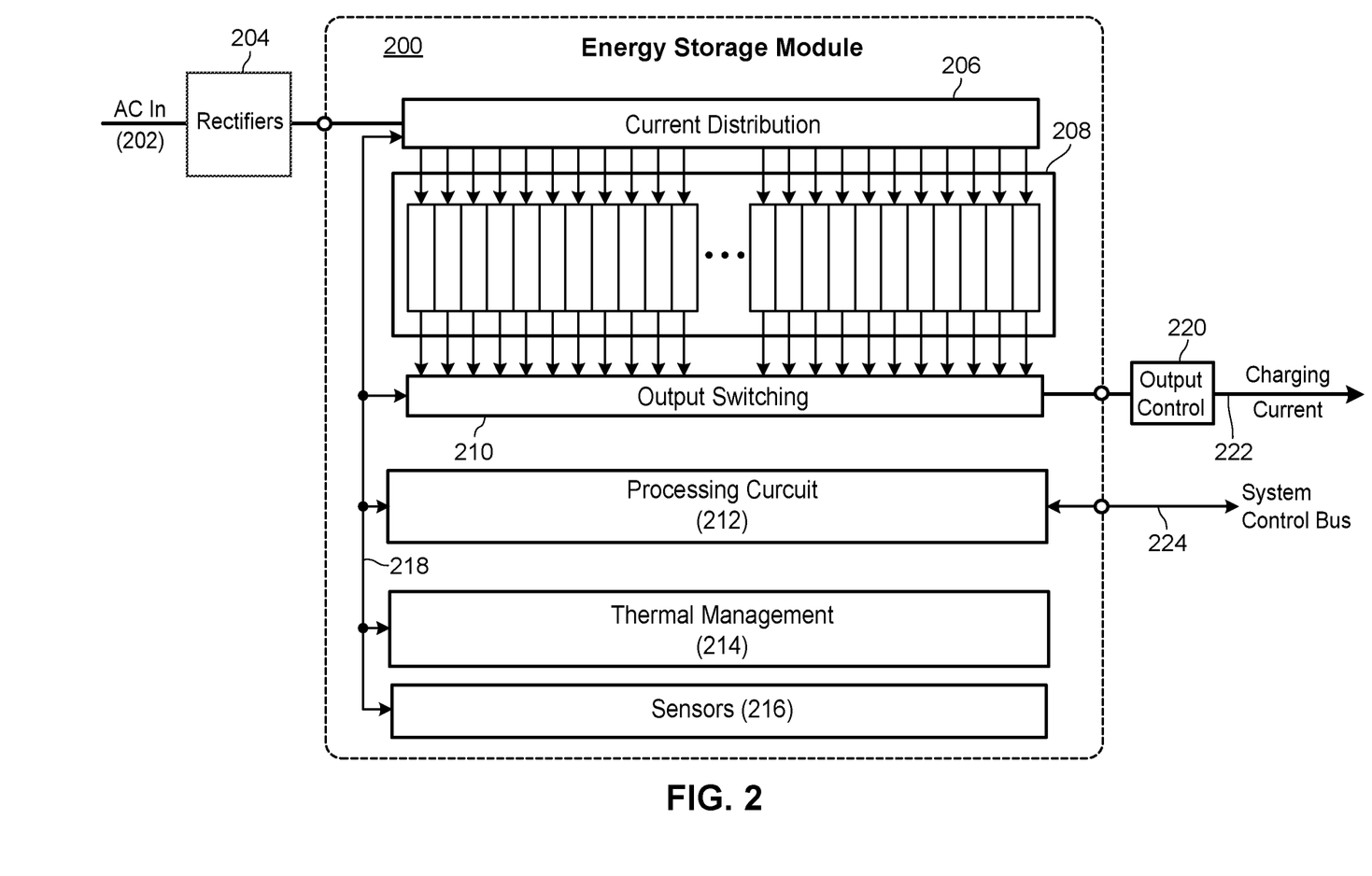
FIG. 2 illustrates an example of an energy storage module configured in accordance with certain aspects of this disclosure.

FIG. 2 illustrates an example of an energy storage module 200 configured in accordance with certain aspects of this disclosure. The energy storage module 200 may correspond to the energy storage module 114 illustrated in FIG. 1, for example. The energy storage module 200 may receive DC power derived from an AC input 202. The AC input 202 may be converted to DC by one or more power conversion circuits. Power conversion circuits may include one or more circuits configurable to transform, condition or otherwise modify the AC input 202 to provide a conditioned DC power output. For example, a generalized power conversion module includes an AC-to-DC conversion circuit that generates a DC charging current. In the illustrated example, the power conversion circuits are represented as a block of rectifiers 204. Multiple power conversion circuits may be provided, with each power conversion circuit being individually controlled to provide a charging current to one or more batteries in a battery pack 208. The power conversion circuits may be controlled or configured to optimize the charging process for each battery or group of batteries in the charging battery pack 208.

The battery pack 208 may be configurable to select groups of batteries to provide charging currents to corresponding EVs during EV charging operations. Each group of batteries may be associated with a conversion circuit. In some instances, a best available conversion circuit may be dynamically selected to charge a group of batteries. Dynamic selection may match available conversion circuits to groups of batteries based on current demand by the group of batteries, current delivery capabilities of the conversion circuits, temperature and other operating conditions of the conversion circuits, and/or for other reasons. A current distribution module 206 may include switching circuits that can couple the outputs of groups of batteries to designated conversion circuits.

The outputs of the batteries in the battery pack 208 may be provided to an output switching circuit 210 that is configured to couple one or more batteries or groups of batteries to provide a charging current 222. The number of batteries or groups of batteries used to provide the charging current 222 may be selected based on capacity of the batteries, current output levels of the batteries and current levels requested by the EV that is being charged. An output control circuit 220 may be provided to deliver output power at a consistent voltage and wattage. The output control circuit 220 may include DC-to-DC converters such as buck and boost circuits that change voltage level of the battery output, filters to remove transients and sensors that can be used to increase or decrease the number of batteries used to produce the charging current 222.

The current distribution module 206, output switching circuit 210, the output control circuit 220 and a thermal management module 214 may respond to commands and control signals provided by a processing circuit 212 that is configured to manage operation of the energy storage module 200. To effect such control and to receive operating data regarding the energy storage module 200, the processing circuit 212 may be communicatively connected to the current distribution module 206, the output switching circuit 210, the thermal management module 214, and sensors 216 by an internal bus 218. The processing circuit 212 may cooperate with external processors to determine and activate configurations of batteries to use for charging an EV, and the processing circuit 212 may be communicatively connected to such external processors via a system control bus 224. In one example, the processing circuit 212 is configured as a finite state machine. In some examples, the processing circuit 212 includes a programmable logic controller (PLC), microcontroller, microprocessor or other type of processor.

The processing circuit 212 may be configured to limit input current flow based on the capacity of a provisioned utility service that provides the AC input 202. In one example, the processing circuit 212 may limit input current to remain with a 30 KW ceiling for a circuit provided by a power utility company. The processing circuit 212 may be further configured to manage power flows when, for example, an EV is drawing 120 KW or more and while the AC input 202 is supplying 30 kW or less. Power flows may be managed by configuring groups of batteries used to provide a desired or requested charging current 222 and switching between groups of batteries when depletion is imminent or when the requested level of the charging current 222 changes.

The thermal management module 214 may include, control, configure or manage the operation of cooling and heating elements, such as HVAC components 160 or coolant pumps 170, which are used to maintain temperatures within minimum and maximum limits defined for the batteries and associated circuits. The heating and cooling elements may include forced air components such as fans or impellers, a coolant supply that is circulated through channels, pipes or ducts within the energy storage module 200, compressors and other components of thermodynamic systems that provide a Carnot cycle, heat pumps, heat exchangers radiant heaters, induction heaters, burners and so on. Cooling may be activated due to environmental conditions or when heat generation by the components of the energy storage module 200 increase internal temperatures. Cooling may be activated due to environmental conditions when external temperatures drop to levels that preclude battery or ancillary circuit operation.

The thermal management module 214 may include or be connected to sensors 216. Certain sensors 216 may be configured to monitor operating conditions within and without the thermal management module 214. Certain sensors 216 may be configured to monitor current flows, battery capacity and/or stored energy levels. The output of the sensors 216 may be monitored by or through the processing circuit 212. In some instances, sensor data may be directly monitored by external processors. In some instances, certain sensors 216 may trigger an event or alarm that causes the processing circuit 212 to immediately terminate operations of the energy storage module 200. In one example, an emergency shutdown may be indicated by an over-temperature, over-current or over-voltage condition. In another example, an emergency shutdown may be executed in response to a command or signal received from an external source such as a facilities management system via a system control bus 224.

Example Power Provisions

As discussed above, the techniques described herein may analyze various currents in the EV charging station 101 to determine if a component is operating properly. Some of these analyzed currents may be the currents provided by the power input 110.

In this regard, it should be understood that power may be provided by the power input 110 in different configurations, such as Wye configured three phase; delta configured three phase; single phase; or split phase (with or without neutral). As will be seen, in accordance with the techniques described, the currents associated with any of these configurations may be analyzed to determine whether a component, such as the HVAC component 160 or display 122, is operating properly. Each of the three power configurations will be discussed below.

Figure 3A:
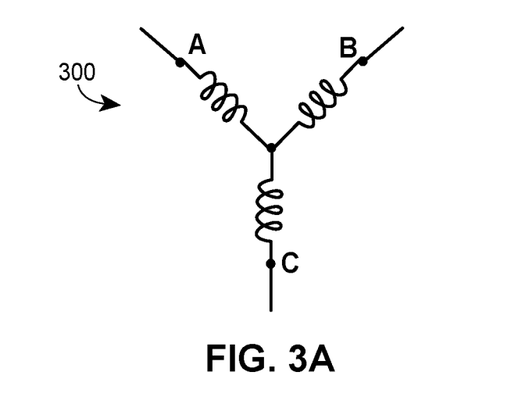
FIG. 3A shows an example Wye configured three phase power supply.
Figure 3B:
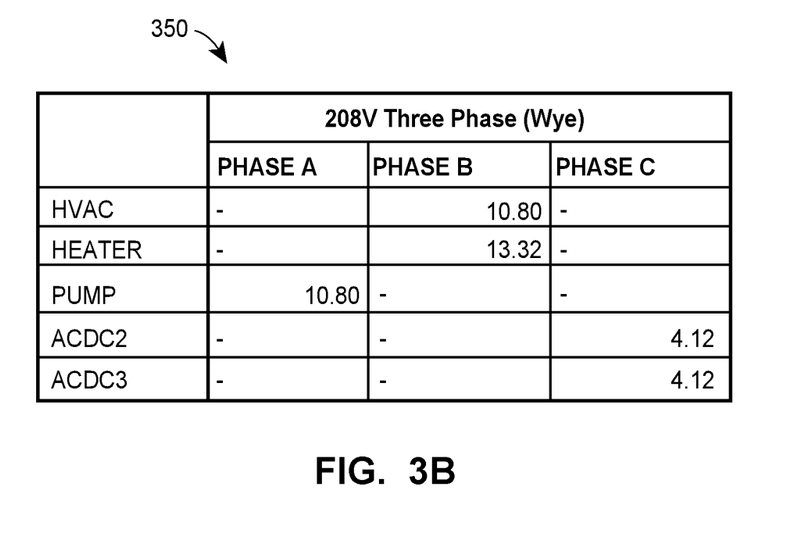
FIG. 3B shows a table of example current measurements corresponding to the example Wye configured three phase power supply of FIG. 3A.

FIG. 3A shows an example Wye configured three phase power system 300 with phases A, B, and C. FIG. 3B shows a table of example current measurements 350 (in Amps) for the example Wye configured three phase power system 300. In the example table 350, the HVAC may correspond to the HVAC component 160; the heater may correspond to a heater of the energy storage 114; the pump may correspond to coolant pump 170; the ACDC2 may correspond to an output to a first battery of the energy storage 114; ACDC3 may correspond to an output to a second battery of the energy storage 114. In the example table 350, all of the HVAC, the heater, the pump, the ACDC2, and the ACDC3 are powered on.

Figure 4A:
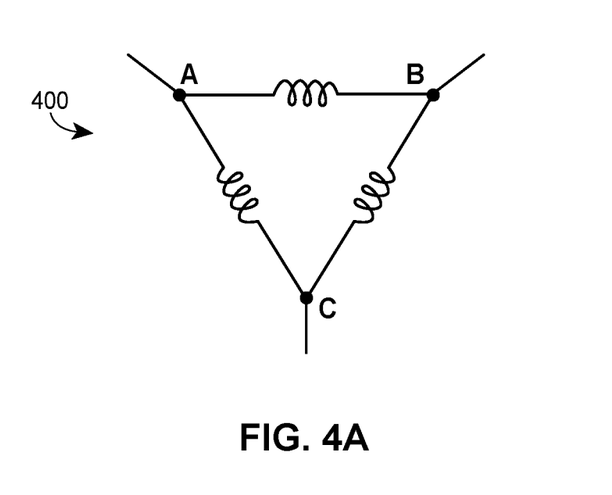
FIG. 4A shows an example delta configured three phase power supply.
Figure 4B:
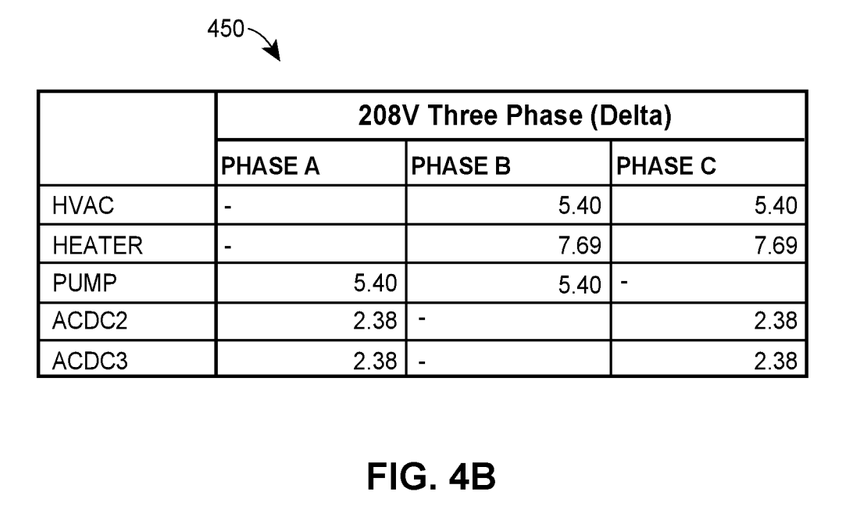
FIG. 4B shows a table of example current measurements corresponding to the example delta configured three phase power supply of FIG. 4A.

FIG. 4A shows an example delta configured three phase power system 400 with phases A, B, and C. FIG. 4B shows a table of example current measurements 450 (in Amps) for the example delta configured three phase power system 400.

In the example table 450, the HVAC may correspond to the HVAC component 160; the heater may correspond to a heater of the energy storage 114; the pump may correspond to coolant pump 170; the ACDC2 may correspond to an output to a first battery of the energy storage 114; ACDC3 may correspond to an output to a second battery of the energy storage 114. In the example table 450, all of the HVAC, the heater, the pump, the ACDC2, and the ACDC3 are powered on.

Figure 5A:
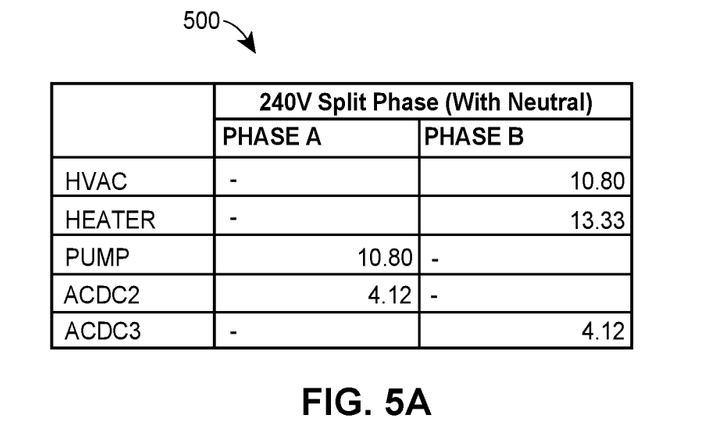
FIG. 5A shows a table of example current measurements corresponding to a split phase with neutral configured power supply.

FIG. 5A shows a table of example current measurements 500 (in Amps) for the split phase with neutral configured power supply. In the example table 500, the HVAC may correspond to the HVAC component 160; the heater may correspond to a heater of the energy storage 114; the pump may correspond to coolant pump 170; the ACDC2 may correspond to an output to a first battery of the energy storage 114; ACDC3 may correspond to an output to a second battery of the energy storage 114. In the example table 500, all of the HVAC, the heater, the pump, the ACDC2, and the ACDC3 are powered on.

Figure 5B:
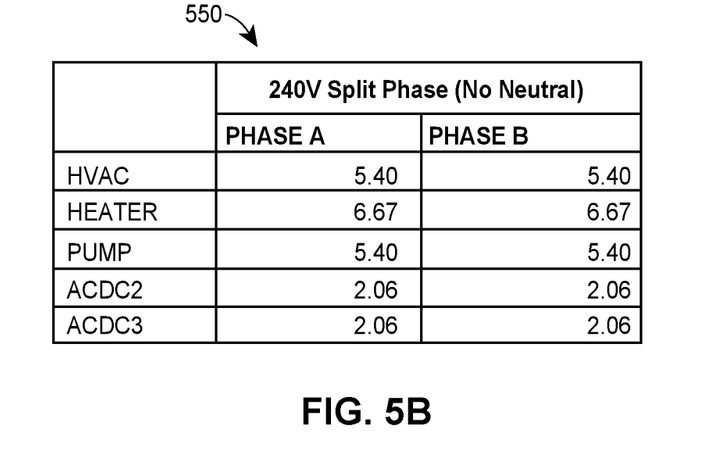
FIG. 5B shows a table of example current measurements corresponding to a split phase without neutral configured power supply.

FIG. 5B shows a table of example current measurements 550 (in Amps) for the split phase without neutral configured power supply. In the example table 550, the HVAC may correspond to the HVAC component 160; the heater may correspond to a heater of the energy storage 114; the pump may correspond to coolant pump 170; the ACDC2 may correspond to an output to a first battery of the energy storage 114; ACDC3 may correspond to an output to a second battery of the energy storage 114. In the example table 550, all of the HVAC, the heater, the pump, the ACDC2, and the ACDC3 are powered on.

As will be seen, the EV charging station controller 120 may use measurements, such as the measurements in any of the example tables 350, 450, 500, 550, to determine if a component in the EV charging station 101 is operating properly.

Example Methods

Figure 6:
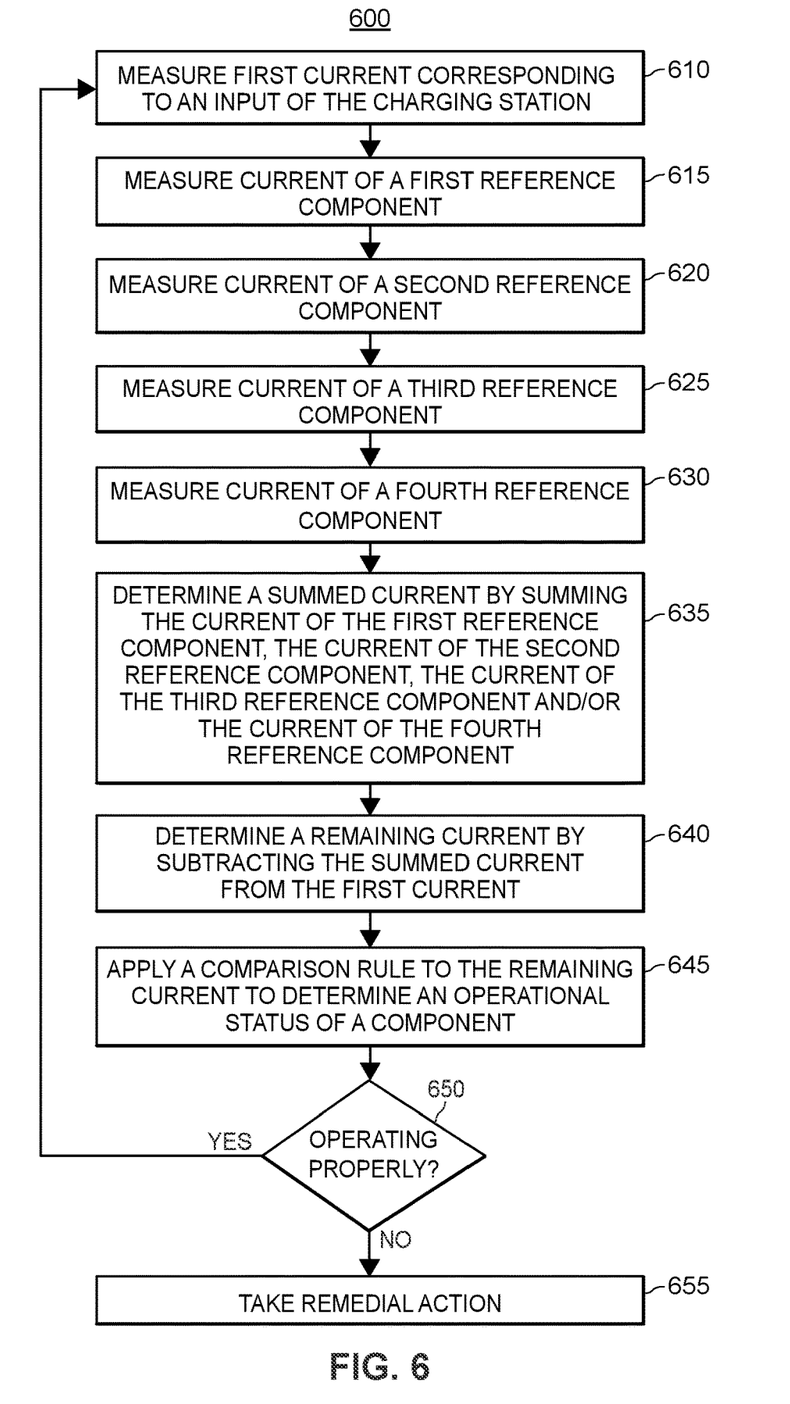
FIG. 6 is a flowchart of a method for determining whether a component in an EV charging station is operating properly.

FIG. 6 is a flowchart of a method for determining whether a component in an EV charging station is operating properly. At block 610, the EV charging station controller 120 may measure a first current corresponding to an input of the EV charging station 101. In some examples, the measured first current is a phase current of a three phase system provided by the power input 110. For example, the measured first current may be a phase current of the example power system 300, or the example power system 400. In other examples, the measured first current is a current of a split phase or single phase system provided by the power input 110.

At block 615, the EV charging station controller 120 may measure a current of a first reference component. The first reference component may be any suitable component of an EV charging station, such as the components illustrated in the example of FIG. 1. Examples of the first reference component include the HVAC component 160, a heater of the energy storage 114, a pump 170, outputs of the energy storage 114 (e.g., the ACDC2, ACDC3 illustrated in FIGS. 3B, 4B, 5A, and 5B), the display 122, etc. Furthermore, in some embodiments, the EV charging station controller 120 receives an indication of an operating state of the first reference component (e.g., that the first reference component is active and is being controlled to operate at a certain level or in a certain mode).

At block 620, the EV charging station controller 120 may measure a current of a second reference component. The second reference component may be any suitable component of an EV charging station, such as the components illustrated in the example of FIG. 1. Examples of the second reference component include the HVAC component 160, a heater of the energy storage 114, a pump 170, outputs of the energy storage 114 (e.g., the ACDC2, ACDC3 illustrated in FIGS. 3B, 4B, 5A, and 5B), the display 122, etc. However, it should be understood that the second reference component is a different component than the first reference component. Furthermore, in some embodiments, the EV charging station controller 120 receives an indication of an operating state of the second reference component (e.g., that the second reference component is active and is being controlled to operate at a certain level or in a certain mode).

At block 625, the EV charging station controller 120 may measure a current of a third reference component. The third reference component may be any suitable component of an EV charging station, such as the components illustrated in the example of FIG. 1. Examples of the third reference component include the HVAC component 160, a heater of the energy storage 114, the pump 170, outputs of the energy storage 114 (e.g., the ACDC2, ACDC3 illustrated in FIGS. 3B, 4B, 5A, and 5B), the display 122, etc. However, it should be understood that the third reference component is a different component than the first, and second reference components. Furthermore, in some embodiments, the EV charging station controller 120 receives an indication of an operating state of the third reference component (e.g., that the third reference component is active and is being controlled to operate at a certain level or in a certain mode).

At block 630, the EV charging station controller 120 may measure a current of a fourth reference component. The fourth reference component may be any suitable component of an EV charging station, such as the components illustrated in the example of FIG. 1. Examples of the fourth reference component include the HVAC component 160, a heater of the energy storage 114, the pump 170, outputs of the energy storage 114 (e.g., the ACDC2, ACDC3 illustrated in FIGS. 3B, 4B, 5A, and 5B), the display 122, etc. However, it should be understood that the fourth reference component is a different component than the first, second, and third reference components. Furthermore, in some embodiments, the EV charging station controller 120 receives an indication of an operating state of the fourth reference component (e.g., that the fourth reference component is active and is being controlled to operate at a certain level or in a certain mode).

In some embodiments, if the input (e.g., the current measured at block 610) is three phase delta configured, the measured current of any of the first, second, third, and/or fourth components may be multiplied by the square root of three ($\sqrt{3}$). In one such example, if the input is delta configured, and the first, second, third, or fourth component is a heater, the measured current of the first, second, third, or fourth component may be multiplied by the square root of three ($\sqrt{3}$). Whether such adjustment is applied may depend upon the type of component, inasmuch as some components may be configured to accept three phase power, while other components may require conversion of the input power to split phase or single phase power.

Figure 7:
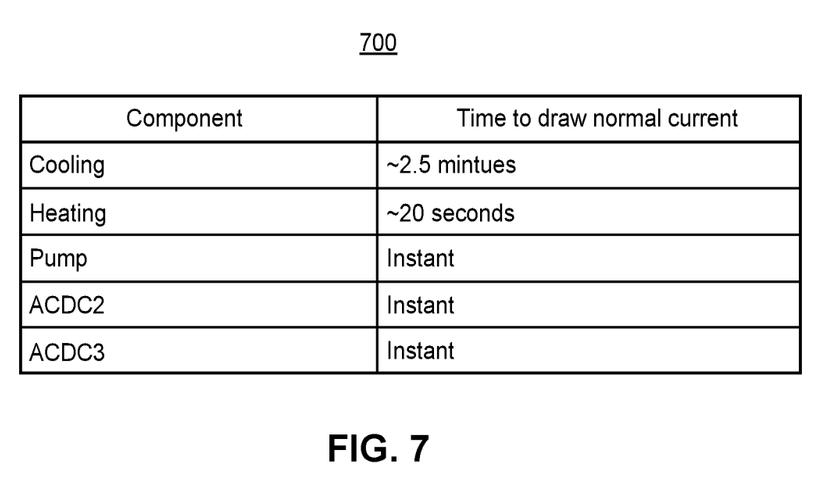
FIG. 7 shows an example table of time to draw nominal current.

Further regarding any of blocks 615-630, in some embodiments, some components may take time to draw current at expected (e.g., steady state) levels. For example, there may be a time period from when the pump 170 is switched on and when the pump 170 draws the amount of current that it is expected to draw during normal operation. Thus, in some embodiments, the EV charging station controller 120 waits a predetermined time period from after it is known that, for example, any of the reference components are switched on before measuring the current for the reference component. In this regard, FIG. 7 shows an example table 700 of time to draw nominal current. In the example table 700, the cooling may correspond to a cooling system of the HVAC component 160 or the energy storage 114; the heating may correspond to a heating system of the HVAC component 160 or the energy storage 114; the pump may correspond to pump 170; the ACDC2 may correspond to an output to a first battery of the energy storage 114; ACDC3 may correspond to an output to a second battery of the energy storage 114. In one working example, the EV charging station controller 120 does not place a wait period before measuring a current of a first reference component (e.g., the pump 170), but does place a wait period before measuring a current of a second reference component (e.g., a heating component of the energy storage 114; and the wait period beginning when the heating component is switched on).

At block 635, the EV charging station controller 120 may sum all of the current of the first reference component, the current of the second reference component, the current of the third reference component, and the current of the fourth reference component to produce a summed current. The summed current represents the total current draw, which is expected to match the current input.

At block 640, the EV charging station controller 120 determines a remaining current by subtracting the summed current from the first current. It should be understood that the remaining current may be positive or negative.

At block 645, the EV charging station controller 120 may apply a comparison rule to the remaining current to determine an operational status of a component. The component may be any suitable component, such as any of the components in the example of FIG. 1. Examples of the component include the HVAC component 160, a heater of the energy storage 114, a pump 170, outputs of the energy storage 114 (e.g., the ACDC2, ACDC3 illustrated in FIGS. 3B, 4B, 5A, and 5B), the display 122, etc. However, it should be understood that the component is a different component than the first, second, and third reference components.

In some examples, different comparison rules are used depending on if the remaining current is positive or negative. In certain such examples, if the remaining current is positive, a minimal on factor indicating the component is active is multiplied by a nominal current factor, and the result is compared to a first predetermined threshold. In some such examples, if the remaining current is positive, and the component is the HVAC component 160, the comparison rule may be stated as:

first predetermined threshold>(minimal on factor)×(Nominal HVAC Current)

In this regard, in some embodiments, if the above comparison rule is satisfied, the EV charging station controller 120 determines the HVAC component 160 to be on. In some embodiments, a minimal on factor may be set between approximately 0.40 and 0.45 (more particularly at approximately 0.42) for the HVAC component 160.

In some examples, if the remaining current is negative, a negative remaining current factor is multiplied by a nominal current factor, and the result is compared to a second predetermined threshold. In some such examples, if the remaining current is negative, and the component is the HVAC component 160, the comparison rule may be stated as:

second predetermined threshold>(negative remaining current factor)×(Nominal HVAC current)

In this regard, in some embodiments, if the above comparison rule is satisfied, the EV charging station controller 120 determines the HVAC component 160 to be on. In some embodiments, a negative remaining current factor may be set between approximately −0.25 and −0.15 (more particularly at approximately −0.20) for the HVAC component 160.

If the EV charging station controller 120 determines the component to be operating properly (block 650), the example method returns to block 610. In this way, the EV charging station controller 120 may continually monitor or check the status of components in the EV charging station 101.

If the component was determined to be not operating properly, a remedial action may be taken at block 655. For example, if an HVAC component 160 has been determined to be not operating properly, the EV charging station controller 120 may: shut down the EV charging station 101; stop charging a battery or batteries of the energy storage module 114; charge a battery or batteries of the energy storage module 114 at a reduced rate (e.g., 75% or lower of a normal rate, 50% or lower of a normal rate, etc.); stop outputting power to the charging head 116 and/or AC power 118; output power to the charging head 116 and/or AC power 118 at a reduced rate (e.g., 75% or lower of a normal rate, 50% or lower of a normal rate, etc.); output an audio and/or visual alarm at the display/user interface 122; report the status to an administrator external to the EV charging station 101 (e.g., send a warning via WiFi to an EV control center if the EV charging station is WiFi enabled); and/or report the status to another EV charging station.

In some embodiments, where the remedial action taken is to alert another EV charging station and/or an external administrator, other EV charging station(s) may take action based on the alert. In some examples, the remedial action sends an alert to another EV charging station, and, in response, the EV charging station that receives the alert displays a message indicating to use it because the EV charging station sending the alert has a malfunctioning component.

Further regarding the example flowchart 600 provided above, it should be noted that all blocks are not necessarily required to be performed. Moreover, additional blocks may be performed although they are not specifically illustrated in the example flowchart 600.

Exemplary Implementation of Vehicle Charging System

Figure 8:
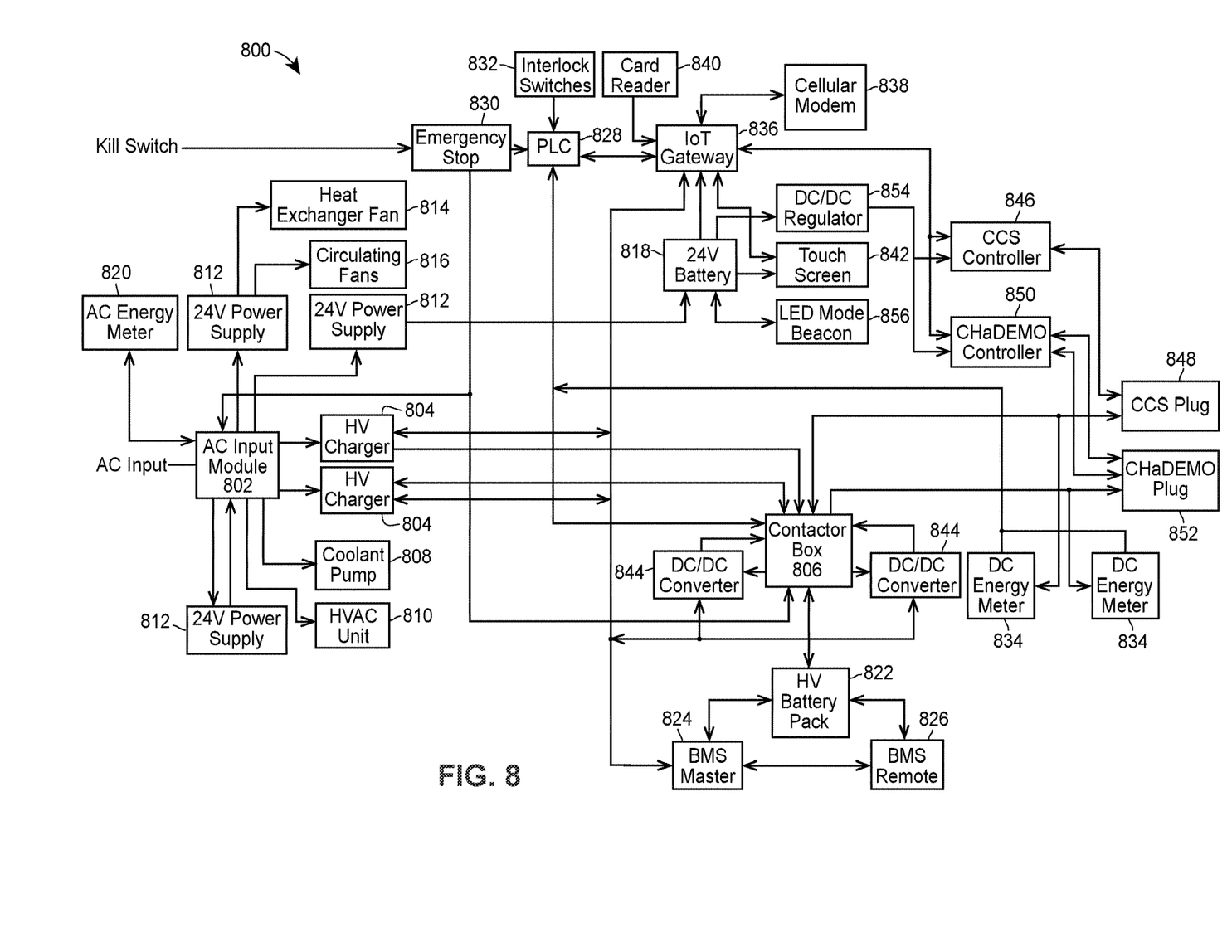
FIG. 8 shows a block schematic diagram of an example of vehicle charging system configured in accordance with certain aspects of this disclosure.

FIG. 8 shows a block schematic diagram of certain components in an example vehicle charging system 800, such as an EV charging system 800. The vehicle charging system 800 receives power at an AC input module 802 from an AC input power source, such as a 120V or 240V single-phase or three-phase electric power grid connection. The AC input module 802 provides the received AC current to a plurality of high-voltage (HV) chargers 804, which convert the AC current to a high-voltage DC current that is then provided to a contactor box 806 for further storage and use in vehicle charging. In addition to providing the received AC current to the HV chargers 804, the AC input module 802 provides power to a plurality of thermal management components, either directly or indirectly. In the illustrated example, the AC input module 802 provides 120V AC current directly to coolant pump 808 and HVAC unit 810. The AC input module 802 provides indirect power to additional components through 24V power supplies 812, which convert the 120V AC current from the AC input module 802 into 24V DC current. The 24V power supplies 812 provide DC current to thermal management components such as a heat exchanger fan 814 and one or more circulating fans 816, as well as to a 24V battery 818. In some examples, the AC input module 802 may include one or more converter circuits to transform, condition or otherwise modify AC input current to provide conditioned AC power to the various components. The AC input module 802 is also connected to an AC energy meter 820 that monitors AC power consumption by the vehicle charging system 800. In some examples, the AC energy meter 820 may further monitor energy consumption at a site where the vehicle charging system 800 is located. The AC energy meter 820 may provide energy usage data to one or more local or remote processing circuits via wired or wireless communication channels (not shown) to facilitate control of charging the HV battery pack 822.

The HV battery pack 822 receives DC power from the contactor box 806, stores the received energy in one or more individual batteries, and provides DC power to the contactor box 806 in order to charge vehicles. The HV battery pack 822 is controlled by a battery management system (BMS), which may include a BMS master controller 824 that provides primary control and a BMS remote controller 826 that provides remote monitoring and analysis of the HV battery pack 822. The contactor box 806 provides power to and receives power from the HV battery pack 822 based upon control commands from a programmable logic controller (PLC) 828 via an I/O connection. The PLC 828 may comprise one or more processors implementing control logic to receive input signals and provide output signals, including control signals to the contactor box 806. The PLC 828 may communicate such signals over one or more communication connections, such as an I/O circuit or a system bus. The PLC 828 receives input signals or data from the contactor box 806, an emergency stop 830 configured to rapidly shut-off charging in response to actuation of a kill switch, one or more interlock switches 832 configured to indicate physical connections of various components within the vehicle charging system 800 (e.g., to shut-off charging when an access panel of the system is opened for maintenance), DC energy meters 834 configured to measure DC energy provided via the charging heads, and an Internet of Things (IOT) Gateway 836. The PLC 828 receives data signals from and provides data signals to each of the contactor box 806 and the IoT gateway 836 in order to monitor relevant conditions and control operation of the vehicle charging system 800.

The IoT gateway 836 serves as a central hub for communication between the PLC 828 and various components of the vehicle charging system 800, as well as for communication with external components via a cellular modem 838 or other electronic communication components. The cellular modem 838 facilitates electronic communication with remote data sources and/or remote control sources, such as a centralized management system configured to manage a plurality of EV charging stations 101. Some such data sources may include IoT devices installed within or external to the vehicle charging system 800. In some embodiments, the PLC 828 receives or generates operating data regarding the vehicle charging system 800 and causes the cellular modem 838 to transmit such operating data to remote servers via the IoT gateway 836. The IoT gateway 836 also communicates with local user interface components, such as a card reader 840 and a touch screen 842, to enable a user to operate the vehicle charging system 800. A user may also operate the vehicle charging system 800 via signals sent from a user computing device (e.g., a smartphone or an onboard computing system of a vehicle) to the cellular modem 838 (e.g., via an Internet connection). The IoT gateway 836 may be configured to communicate with components of the system via a local bus in order to receive operating data from and/or to send control signals to the HV chargers 804, the BMS master controller 824, and one or more DC/DC converters 844 configured to convert between a battery voltage level of the HV battery pack 822 and a charging voltage level used to charge a vehicle.

Additionally, the IoT gateway 836 communicates with one or more charging head controllers, each associated with a vehicle charging plug. In the illustrated example, the IoT gateway 836 communicates with a combined charging system (CCS) controller 846 connected to a CCS plug 848 and also communicates with a CHaDEMO controller 850 connected to a CHaDEMO plug 852. Each of the charging head controllers (i.e., the CCS controller 846 and the CHaDEMO controller 850) is powered by the 24V battery 818 through a DC/DC regulator 854 in order to control the supply of charging current to a vehicle through the respective vehicle charging plug. Each of the CCS plug 848 and the CHaDEMO plug 852 is also connected to the contactor box 806 to receive the charging current. To supply the charging current, the contactor box 806 is controlled by the PLC 828 to actuate switches to connect groups of batteries from the HV battery pack 822 to one or more DC/DC converters 844, which may include power conversion circuits such as buck and boost circuits that change voltage level of the battery output and other components to filter or otherwise condition the output charging current for charging a vehicle. In some examples, a first DC/DC converter 844 is configured to provide charging current suitable for the CCS plug 848, while a second DC/DC converter is configured to provide charging current suitable for the CHaDEMO plug 852.

The 24V battery 818 provides power to the DC/DC regulator 854, the IoT gateway 836, the touch screen 842, and an LED mode beacon 856 to ensure temporary continued operation for a short duration in the event of loss of power from the AC input. Likewise, the 24V battery 818 may provide power to the PLC 828 either directly or through the IoT gateway 836. The LED mode beacon may present visual indications of the current operating status of the vehicle charging system 800 via one or more LED lighting elements in order to signal availability, unavailability, charge level, or other relevant information to users or potential users of the system.

Other Matters

Additionally, certain embodiments are described herein as including logic or a number of routines, subroutines, applications, or instructions. These may constitute either software (code embodied on a non-transitory, tangible machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of geographic locations.

Furthermore, the patent claims at the end of this patent application are not intended to be construed under 35 U.S.C. § 112(f) unless traditional means-plus-function language is expressly recited, such as "means for" or "step for" language being explicitly recited in the claim(s). The systems and methods described herein are directed to an improvement to computer functionality, and improve the functioning of conventional computers.

What is claimed:

1. A computer-implemented method for determining whether a component in an electric vehicle (EV) charging station is operating properly, the method comprising:
    measuring, via an EV charging station controller, a first current, wherein the first current is a current corresponding to an input to the EV charging station;
    measuring, via EV charging station controller, a current of a first reference component;
    measuring, via the EV charging station controller, a current of a second reference component;
    determining, via the EV charging station controller, a summed current by summing the current of the first reference component and the current of the second reference component;
    determining, via the EV charging station controller, a remaining current by subtracting the summed current from the first current; and
    applying, via the EV charging station controller, a comparison rule to the remaining current to determine an operational status of the component.

2. The computer-implemented method of claim 1, wherein the first current is a current of a phase of Wye configured three phase power delivered to the EV charging station.

3. The computer-implemented method of claim 1, wherein the first current is a current between phases of delta configured three phase power delivered to the EV charging station.

4. The computer-implemented method of claim 1, wherein the first current is a current of split phase power delivered to the EV charging station.

5. The computer-implemented method of claim 1, wherein the component is a heating, ventilation, and air conditioning (HVAC) component including a heater, a fan, or a condenser.

6. The computer-implemented method of claim 1, wherein the first reference component comprises: an output or load of an energy storage component; a heater; a pump; or a charging head.

7. The computer-implemented method of claim 1, wherein the applying the comparison rule comprises:
    determining, via the EV charging station controller, that the remaining current is positive; and
    in response to the determination that the remaining current is positive, setting, via the EV charging station controller, the comparison rule according to a minimal on factor.

8. The computer-implemented method of claim 1, wherein the component is an HVAC component, and the method further comprises:
    determining, via the EV charging station controller, that the remaining current is positive; and
    in response to the determination that the remaining current is positive, the applying the comparison rule comprises determining that the HVAC component is powered on in response to a determination that the remaining current is greater than a minimal on factor multiplied by a nominal HVAC current, wherein the minimal on factor is between 0.4 and 0.45.

9. The computer-implemented method of claim 1, wherein the applying the comparison rule comprises:

determining, via the EV charging station controller, that the remaining current is negative; and in response to the determination that the remaining current is negative, setting, via the EV charging station controller, the comparison rule according to a negative remaining current factor.

10. The computer-implemented method of claim 1, wherein:

the applying the comparison rule determines the operational status to be inoperable; and in response to the determination that the operational status is inoperable, setting, via the one or more processors, a battery included in an energy storage module to charge at a reduced rate.

11. A non-transitory computer-readable storage medium for determining whether a component in an electric vehicle (EV) charging station is operating properly comprising instructions that, when executed, cause a processor to:

measure a first current, wherein the first current is a current corresponding to an input to the EV charging station;

measure a current of a first reference component;

measure a current of a second reference component;

determine a summed current by summing the current of the first reference component and the current of the second reference component;

determine a remaining current by subtracting the summed current from the first current; and apply a comparison rule to the remaining current to determine an operational status of the component.

12. The non-transitory computer-readable storage medium of claim 11, wherein the first current is a current of a phase of Wye configured three phase power delivered to the EV charging station.

13. The non-transitory computer-readable storage medium of claim 11, wherein the first current is a current between phases of delta configured three phase power delivered to the EV charging station.

14. The non-transitory computer-readable storage medium of claim 11, wherein the first current is a current of single phase power delivered to the EV charging station.

15. The non-transitory computer-readable storage medium of claim 11, wherein the instructions, when executed, further cause the processor to apply the comparison rule by:

determining that the remaining current is positive; and if the remaining current is positive, set the comparison rule according to a minimal on factor.

16. A computer system for determining whether a component in an electric vehicle (EV) charging station is operating properly, the system comprising:

one or more processors; and a non-transitory program memory communicatively coupled to the one or more processors and storing executable instructions that, when executed by the one or more processors, cause the computer system to:

measure a first current, wherein the first current is a current corresponding to an input to the EV charging station;

measure a current of a first reference component;

measure a current of a second reference component;

determine a summed current by summing the current of the first reference component and the current of the second reference component;

determine a remaining current by subtracting the summed current from the first current; and apply a comparison rule to the remaining current to determine an operational status of the component.

17. The computer system of claim 16, wherein the first current is a current of a phase of Wye configured three phase power delivered to the EV charging station.

18. The computer system of claim 16, wherein the first current is a current between phases of delta configured three phase power delivered to the EV charging station.

19. The computer system of claim 16, wherein the first current is a current of single phase power delivered to the EV charging station.

20. The computer system of claim 16, wherein the instructions, when executed, further cause the processor to apply the comparison rule by:

determining that the remaining current is positive; and if the remaining current is positive, set the comparison rule according to a minimal on factor.

\* \* \* \* \*